US011997818B2

(12) United States Patent
Aguera et al.

(10) Patent No.: US 11,997,818 B2
(45) Date of Patent: May 28, 2024

(54) INTERCONNECTION SYSTEM FOR A RACK OF A SYSTEM OF AN AIRCRAFT

(71) Applicant: LATELEC, Labege (FR)

(72) Inventors: Damien Aguera, Tournefeuille (FR); Yannick Marin, Le Castera (FR); Vincent Banasiak, Aucamville (FR); Bastien Puertolas, Aigrefeuille (FR)

(73) Assignee: LATELEC, Labege (FR)

( * ) Notice: Subject to any disclaimer, the term of this patent is extended or adjusted under 35 U.S.C. 154(b) by 717 days.

(21) Appl. No.: 17/254,687

(22) PCT Filed: Jun. 17, 2019

(86) PCT No.: PCT/EP2019/065875
§ 371 (c)(1),
(2) Date: Dec. 21, 2020

(87) PCT Pub. No.: WO2019/243251
PCT Pub. Date: Dec. 26, 2019

(65) Prior Publication Data
US 2021/0282290 A1 Sep. 9, 2021

(30) Foreign Application Priority Data

Jun. 22, 2018 (FR) ...................................... 1855582

(51) Int. Cl.
H05K 7/00 (2006.01)
H01R 12/71 (2011.01)
H05K 7/14 (2006.01)

(52) U.S. Cl.
CPC ........... *H05K 7/1449* (2013.01); *H01R 12/71* (2013.01)

(58) Field of Classification Search
CPC .............................. H05K 7/1449; H01R 12/71
See application file for complete search history.

(56) References Cited

U.S. PATENT DOCUMENTS 5,388,995 A * 2/1995 Rudy, Jr. ............ H01R 13/6596
361/730
6,394,815 B1 * 5/2002 Sarno ................... H05K 7/1449
361/788

(Continued)

FOREIGN PATENT DOCUMENTS

EP 3008983 A1 4/2016
FR 2927222 A1 8/2009
FR 2977447 A1 1/2013

OTHER PUBLICATIONS

Aug. 16, 2019 International Search Report issued in International Patent Application No. PCT/EP2019/065875.

*Primary Examiner* — Pete T Lee
(74) *Attorney, Agent, or Firm* — Williams Mullen; R. Brian Drozd

(57) ABSTRACT

An interconnection system for a rack of a system of an aircraft is provided. The rack includes at least one shelf with at least one frame adapted to receive an electronic device, the interconnection system comprising a rear panel, consisting of a printed circuit, the rear panel comprising as many coupling fittings as connectors of the shelf, each coupling fitting being connected to a connector, at least one interface for connecting a lateral panel consisting of an electronic circuit board, the lateral panel comprising: an interface for connecting the rear panel and connectors allowing a connection to the system of the aircraft, the printed circuit of the rear panel allowing a set of predefined electrical links between the connectors and the interface, the electronic circuit board of the lateral panel allowing a set of electrical links to be set up between the interface and the connectors to the system of the aircraft.

6 Claims, 3 Drawing Sheets

(56) References Cited

U.S. PATENT DOCUMENTS

| | | | |
|---|---|---|---|
| 8,717,776 B2* | 5/2014 | Colongo | H05K 7/1449 |
| | | | 361/807 |
| 2004/0100783 A1 | 5/2004 | Amit | |
| 2016/0049760 A1* | 2/2016 | Pradier | H01R 27/02 |
| | | | 439/639 |
| 2016/0095202 A1* | 3/2016 | Min | H05K 3/4608 |
| | | | 174/262 |
| 2018/0069383 A1* | 3/2018 | Brett | H02B 1/34 |

* cited by examiner

INTERCONNECTION SYSTEM FOR A RACK OF A SYSTEM OF AN AIRCRAFT

The present invention relates to the field of the systems that are embedded in an airplane. The invention relates more particularly to an interconnection system for a rack of a system of an aircraft.

An aircraft comprises a multitude of systems comprising electronic devices providing various functions (avionic systems, navigation systems, smoke detectors, alarm computers, electrical systems, air-conditioning systems, entertainment systems for the passengers, etc.). In order to simplify maintenance, these electronic devices of the systems are made easily replaceable by being removably mounted in frames of a rack. That allows for example an operator to extract a faulty electronic device from its frame to replace it with another electronic device providing the same function, or else to install a new electronic device providing other functions in place of an electronic device. These are called "Line Replaceable Units", or LRU. Each electronic device can therefore be inserted into a frame (or accommodating slot) of an avionics rack intended to accommodate a plurality of electronic devices. An avionics rack can correspond to a cabinet comprising one or more shelves, each shelf being able to comprise one or more frames, each frame being adapted to accommodate an electronic device of LRU type.

Figure 1:
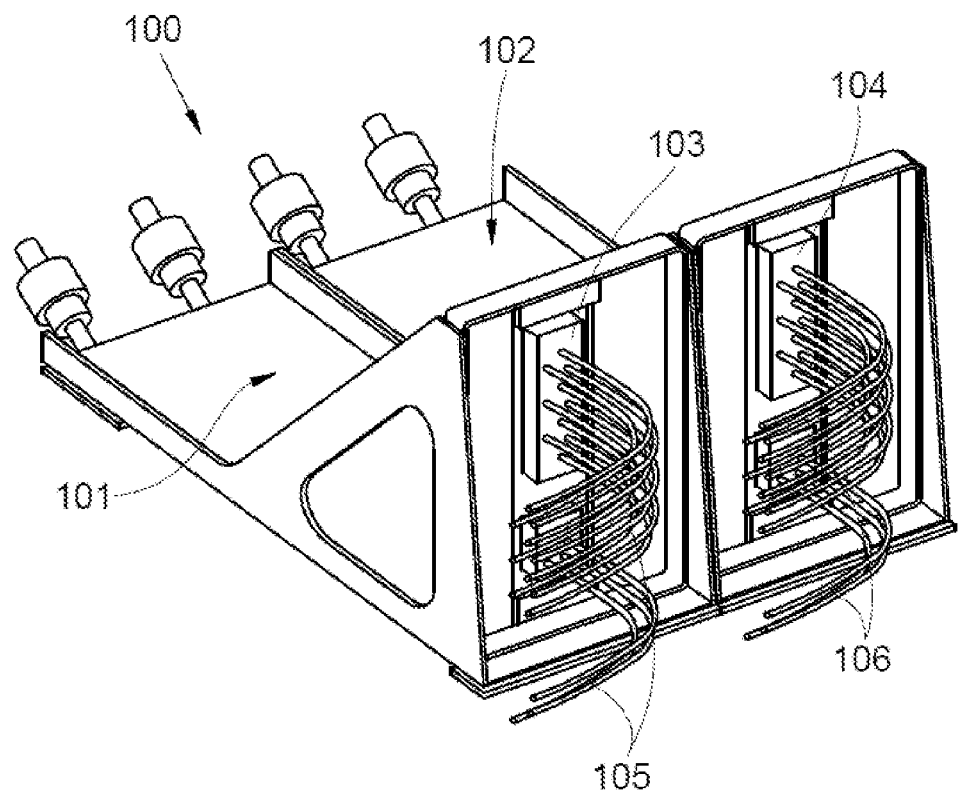

FIG. 1 thus illustrates a rack 100 comprising two frames 101 and 102 of a system of an aircraft, the two frames being on one and the same shelf of the rack 100. The frames 101 and 102 are adapted to each receive an electronic device or LRU. When an electronic device is installed in the frame 101, respectively 102, a connector incorporated in said electronic device is connected to the connector 103, respectively to the connector 104. Typically, the frames 101 and 102, and the connectors 103 and 104, conform to a standard, for example the "ARINC 600" standard (ARINC standing for "Aeronautical Radio, Incorporated"). Each connector of the frames must be wired to the system of the aircraft. Thus, the set of cables 105, respectively cables 106, allows a connection of the electronic device installed in the frame 101, respectively the frame 102, to the system of the aircraft. Each connector, for example the connectors 103 and 104, of each frame of each shelf of the rack must therefore be wired to the system of the aircraft. This solution presents drawbacks.

First of all, the set of cables used ends up representing a certain weight, and, consequently, a certain cost. Likewise, with the avionics systems comprising increasingly more electronic devices, the cables end up occupying a significant volume around the racks of these avionics systems, and the implementation thereof is lengthy and complex. In addition to the fact that the volume is limited in an aircraft, that can pose problems of accessibility during aircraft maintenance.

Then, the wiring of a frame often needs to be reworked or, at the very least, modified when an electronic device installed in the frame is replaced by another electronic device offering, for example, other functions. The wiring operation required is a difficult operation, that has to be performed by qualified personnel, and is costly in terms of maintenance time. The cost in terms of maintenance time is all the greater since a step of checking the correct completion of the wiring is necessary.

It is therefore necessary to propose an interconnection system for a rack of a system of an aircraft that makes it possible to overcome these drawbacks.

The invention relates to an interconnection system for a rack of a system of an aircraft, the rack comprising at least one shelf comprising at least one frame, each frame being adapted to receive an electronic device and comprising a connector allowing, on a first side, a connection of said electronic device, and, on a second side, a connection to the system of the aircraft, the interconnection system comprising:
- a so-called rear panel, consisting of a printed circuit, the rear panel comprising:
  - as many coupling fittings as connectors of the shelf, each coupling fitting being connected to a second side of a corresponding connector,
  - at least one interface for connecting a so-called lateral panel,
- the so-called lateral panel, consisting of an electronic circuit board, the lateral panel comprising:
  - at least one interface for connecting the so-called rear panel,
  - a plurality of connectors allowing a connection to the system of the aircraft,
- the printed circuit of the rear panel allowing a set of predefined electrical links between the connectors and the interface, the electronic circuit board of the lateral panel allowing a set of electrical links to be set up between the interface and the connectors to the system of the aircraft.

Advantageously, the interconnection system makes it possible to dispense with cables previously described, hence a gain in volume and a reduced cost. These cables are replaced by a combination of a so-called rear panel and of a so-called lateral panel. The rear panel, comprising a printed circuit, makes it possible to refer all the wiring from the frames of each shelf to the lateral panel, the latter allowing an interconnection to a system of an aircraft. The rear panel is a passive element, not requiring maintenance. The printed circuit can comprise a multitude of predefined wiring configurations necessary to a rack, which avoids any rewiring operation when an electronic device of a frame is modified. Maintenance is thereby facilitated. It should be noted that the installation of a rack is also greatly facilitated, the tedious operation of wiring all the connectors of the frames of a shelf of a rack being replaced by an installation of a rear panel.

According to a complementary embodiment of the invention, the electrical links between the second sides of the connectors and the corresponding coupling fittings of the rear panel are produced by ribbon cables and/or electrical wires.

According to a complementary embodiment of the invention, each second side of each connector of the shelf comprises a flexible part intended to come to bear on a coupling fitting of the rear panel, each flexible part comprising integrated electrical links, each coupling fitting of the rear panel comprising a plurality of electrical contacts, each second side of the connectors coming to bear flexibly on a coupling fitting of the rear panel when the rear panel is securely fixed to the shelf.

According to a complementary embodiment of the invention, the printed circuit of the rear panel consists of different flexible and rigid parts, the rigid parts, comprising the coupling fittings, being fixed on each second side of the connectors of the shelf and the flexible parts being disposed between two rigid parts.

According to a complementary embodiment of the invention, the printed circuit of the rear panel consists of different parts:

a plurality of rigid parts, called connections, comprising the coupling fittings, disposed facing each second side of the connectors of the shelf, a rigid part, called routing, comprising a routing of the electrical links from the printed circuit, the rigid part being securely fixed with the shelf, and a plurality of flexible parts allowing a connection of each rigid connection part with the rigid routing part.

According to a complementary embodiment of the invention, at least one so-called connection rigid part is interchangeable in order to be adapted to a type of connector of a frame of the shelf.

According to a complementary embodiment of the invention, the printed circuit of the rear panel is a multilayer printed circuit.

According to a complementary embodiment of the invention, the printed circuit of the rear panel comprises an electrical link linked to a plurality of electrical links from the connectors.

According to a complementary embodiment of the invention, the printed circuit of the rear panel comprises an electrical link linked on one side to an output interface of the rear panel intended to be connected to a ground of the shelf, and, on another side, to a plurality of electrical links from the connectors.

According to a complementary embodiment of the invention, the lateral panel being incorporated in an electronic device that can fit in a frame of the shelf, the interface between the lateral panel and the rear panel is the connector of said frame.

According to a complementary embodiment of the invention, the electronic circuit of the lateral panel is adapted to perform switching functions between the electrical links, perform so-called "hardware pin programming" functions on the electrical links and/or convert an electrical, respectively optical, signal into an optical, respectively electrical, signal.

Figure 2:
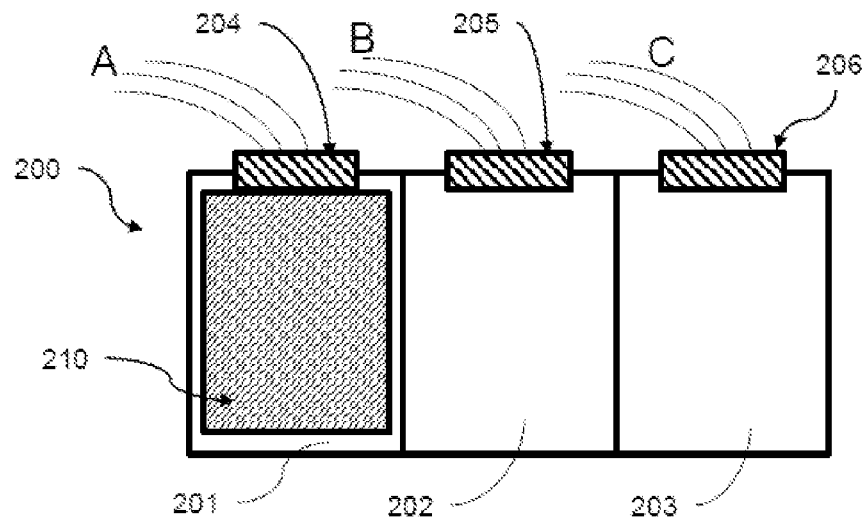
Figure 3:
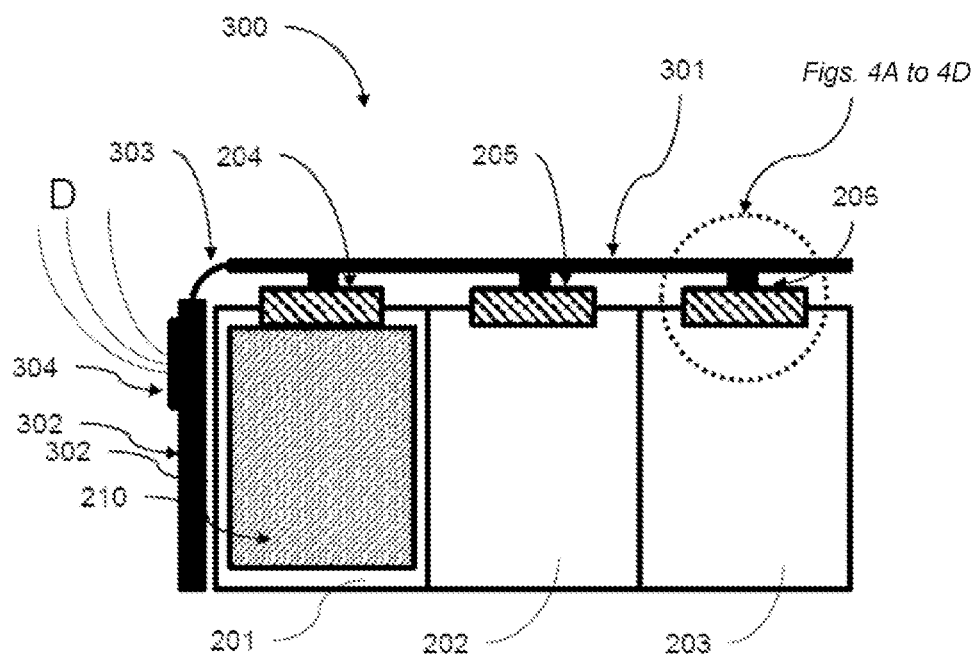
Figure 4A:
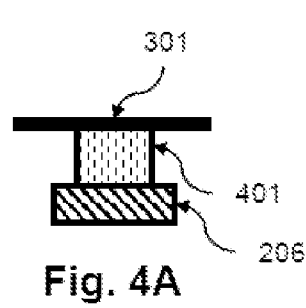
Figure 4B:
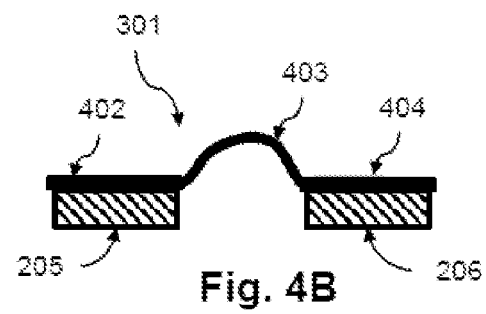
Figure 4C:
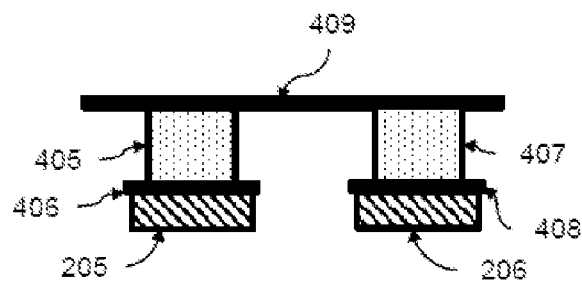
Figure 4D:
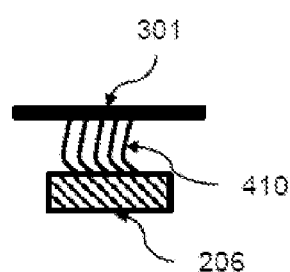
Figure 5:
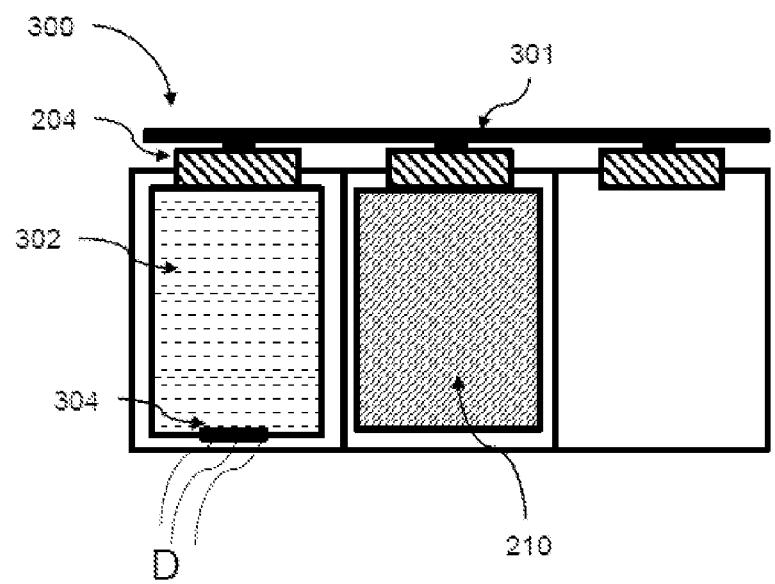

The features of the invention mentioned above, and others, will become more clearly apparent on reading the following description of an exemplary embodiment, said description being given in relation to the attached drawings, in which:

FIG. 1 schematically illustrates a shelf of a rack of a system of an aircraft comprising two frames as known to the person skilled in the art, FIG. 2 schematically illustrates a shelf of a rack of a system of an aircraft comprising three frames, seen from above, as known to the person skilled in the art, FIG. 3 schematically illustrates a shelf of a rack of a system of an aircraft, seen from above, comprising an interconnection system according to an embodiment of the invention, FIGS. 4A to 4D schematically illustrate an interconnection between one or more frame connectors with a rear panel according to different embodiments of the invention, FIG. 5 schematically illustrates a shelf of a rack of a system of an aircraft, seen from above, comprising an interconnection system according to an alternative embodiment of the invention.

FIG. 2 schematically illustrates a shelf of a rack 200 of a system of an aircraft, comprising three frames 201, 202 and 203, seen from above, as known to the person skilled in the art. Typically, the shelf of the rack 200, and the frames and connectors, conform to a standard, for example the "ARINC 600" standard.

In this example, an electronic device (or LRU) 210 is inserted into the frame 201. Each frame 201, 202 or 203 comprises a connector 204, 205 or 206 that makes it possible to connect, via wirings A, B or C, an electronic device installed in the corresponding frame. The set of the cables A, B and C can comprise a multitude of electrical cables. The proliferation of frames similar to the frames 201, 202 and 203 in each shelf of a rack can end up representing a consequential cable volume and weight. Furthermore, since the wirings A, B and C are situated at the rear of each shelf of the rack 200, access can be difficult.

FIG. 3 schematically illustrates a shelf of a rack 300 of a system of an aircraft, seen from above, comprising an interconnection system according to an embodiment of the invention. Typically, the shelf of the rack 300, and the frames and connectors, conform to a standard, for example the "ARINC 600" standard. The shelf of the rack 300 corresponds to the shelf of the rack 200 for which the technical solution presented in the present document has been installed. Each frame 201, 202 and 203 is adapted to receive an electronic device (for example 210) and comprises a connector 204, 205 or 206 that allows, on a first side, a connection of said electronic device, and, on a second side, a connection to the system of the aircraft, via the wiring A, B or C. In other words, the shelf of the rack 300 corresponds to the shelf of the rack 200 for which the wirings A, B and C to the system of the aircraft have advantageously been eliminated and replaced by:

a so-called rear panel 301, consisting of a printed circuit, the rear panel comprising:

as many coupling fittings as connectors 204, 205 and 206 of the shelf, each coupling fitting being connected to a second side of a corresponding connector 204, 205 or 206, at least one interface 303 for connecting a so-called lateral panel, the so-called lateral panel 302, consisting of an electronic circuit board, the lateral panel comprising:

at least one interface 303 for connecting the so-called rear panel, a plurality of connectors 304 allowing a connection to a system of the aircraft.

It should be noted that the designations of the so-called rear panel 301 and of the so-called lateral panel 302 correspond to their positions relatively to the shelf according to an embodiment of the invention. These positions relatively to the shelf of each panel can however vary according to the embodiment of the invention. In particular, the so-called lateral panel 302 can have a position other than a lateral position relatively to the shelf. The so-called lateral panel can thus be disposed on the front face of a dedicated frame, as described hereinbelow. The printed circuit of the rear panel 301 allows a set of predefined electrical links between the connectors 204, 205 and 206 and the interface 303. The electronic circuit board of the lateral panel 302 allows a set of electrical links to be set up between the interface 303—and therefore the connectors 204, 205 and 206—and the connectors 304 to the system of the aircraft.

Thus, the cables A, B and C of FIG. 2 are eliminated, and replaced by a gathering of the electrical links from the connectors 204, 205 and 206 by the printed circuit of the rear panel 301, then by a possible multiplexing, switching, grounding, equipotential leveling, conversion to an optical signal by the lateral panel 302. The actual interconnection to a system of the aircraft is made then via the connector 304 of the lateral panel 302 via the wiring D. The wiring D needs to be done only once upon installation of each shelf of the rack. The wiring D reworks the existing wiring to the system of the aircraft, which makes the technical solution presented compatible with the existing aircraft without having to redo or replace all the wiring of the aircraft.

According to a complementary embodiment of the invention, the printed circuit of the rear panel 301 is a multilayer printed circuit. Thus, it is possible to arrange electrical signals of different kinds (discrete, rapid, power, etc. electrical signals) within integrated circuits at different layers of the printed circuit without the latter disturbing one another. One and the same multilayer printed circuit therefore replaces a multitude of cables for a saving in terms of weight and volume.

The printed circuit of the rear panel 301 can comprise circuits allowing a grounding or an equipotential leveling of different electrical links from the connectors of the frames. The rear panel 301 can then comprise one or more interfaces (not represented) allowing a grounding of said circuits to the ground of the system of the aircraft. The ground modules or the equipotential modules are therefore advantageously replaced, with, here again, a saving in terms of weight and volume.

The printed circuit of the rear panel can comprise a multitude of predefined electrical links, for example reserve electrical links. These electrical links are then produced with no additional cost in terms of weight or volume since they are incorporated in the printed circuit.

FIGS. 4A to 4D schematically illustrate an interconnection between one or more frame connectors 204, 205 and 206 with a rear panel according to different embodiments of the invention. The object of the various solutions presented in FIGS. 4A to 4D is to allow a mechanical decoupling between the rear panel 301, which is rigid and has to be protected from mechanical stresses, and the other elements of each shelf of the rack. FIGS. 4A to 4D illustrate the detail of FIG. 3 delimited by a dotted-line circle around the connector 206 in FIG. 3.

FIG. 4A illustrates a first technical solution allowing a decoupling between the rear panel 301 and the elements of the shelf of the rack 300. In this solution, each second side of each connector 204, 205 and 206 of the shelf of the rack 300 comprises a flexible part 401 intended to come to bear on a coupling fitting of the rear panel, each flexible part 401 comprising an integrated electrical wiring. Each coupling fitting of the rear panel comprises a plurality of electrical contacts, the electrical contacts facing the electrical wiring of the flexible part 401. Thus, when the panel 301 is fixed to the rear of the shelf of the rack 300, it is mounted to bear on these flexible parts 401, which guarantees, on the one hand, the setting-up of the electrical links, and, on the other hand, a mechanical decoupling via the flexibility of the flexible parts 401. The connectors 204, 205 and 206 must previously have been modified. The mounting of the rear panel 301 bearing on the flexible parts is particularly easy.

FIG. 4B illustrates a second technical solution allowing a decoupling between the rear panel 301 and the elements of the shelf of the rack 300. In this solution, the printed circuit of the rear panel 301 consists of different parts: some parts of the printed circuit are flexible, others are rigid. The rigid parts 402 and 404 of the printed circuit are those comprising the coupling fittings. These rigid parts are fixed to each second side of the connectors 204, 205 or 206 of the shelf of the rack 300. The flexible parts 403 of the printed circuit of the rear panel 301 are those situated between two rigid parts. The rear panel thus consists of a succession of rigid and flexible parts, the rigid parts making it possible to ensure a connection to the connectors 204, 205 and 206 of the shelf of the rack 300, the flexible parts ensuring a mechanical decoupling between the different rigid parts of the rear panel (each connector 204, 205 or 206 being able to vary slightly in position independently of the other connectors). The printed circuit forming the rear panel 301 is said to be "flex-rigid". In this solution, the connectors 204, 205 and 206 are not modified. This solution allows an easy assembly of the rear panel 301 on the shelf of the rack 300.

FIG. 4C illustrates a third technical solution allowing a decoupling between the rear panel 301 and the elements of the shelf of the rack 300. In this solution, the printed circuit of the rear panel 301 consists of different parts:
- a plurality of so-called connection rigid parts 406 and 408, comprising the coupling fittings, disposed facing each second side of the connectors 205 and 206 of the shelf of the rack 300,
- a so-called routing rigid part 409, comprising a routing of the electrical links of the printed circuit, the rigid part being securely fixed with the shelf of the rack 300, and
- a plurality of flexible parts 405 and 407 allowing a connection of each rigid connection part with the rigid routing part.

In other words, the rear panel 301 is divided into two parts:
- a routing part 409, structurally similar to the rear panel 301, of a piece, comprises the routing of the electrical links, and as many interfaces as connectors 204, 205 and 206,
- a plurality of connection parts 406 or 408, as many as connectors, each connection part being connected to a connector 204, 205 or 206, and
- flexible parts 405 and 407 allowing the connection parts to be connected to the routing part.

According to one embodiment of the invention, at least one so-called connection rigid part is interchangeable in order to be adapted to a type of connector of a frame of the shelf of the rack. Indeed, the type of connector of each frame can vary according to the equipment to be accommodated or a standard followed. This solution advantageously allows one connection part to be replaced with another if a connector of a frame of the shelf of the rack 300 changes format, without changing all of the rear panel. It is then sufficient to deconnect the corresponding connection part to replace it with another suited to the new connector. The flexible parts 405 and 407 are typically a flexible printed circuit or a ribbon cable.

FIG. 4D illustrates a fourth technical solution allowing a decoupling between the rear panel and the elements of the shelf of the rack 300. In this solution, the electrical links between the second sides of the connectors 204, 205 and 206 and the corresponding coupling fittings of the rear panel 301 are produced by ribbon cables and/or electrical wires 410. The advantage of this solution is that the printed circuit can be a conventional rigid printed circuit, which reduces the complexity, and therefore the cost, of the solution.

FIG. 5 schematically illustrates the shelf of the rack 300 of a system of an aircraft, seen from above, comprising an interconnection system according to an alternative embodiment of the invention. In this solution, the lateral panel 302 takes the form of an electronic device 302. Said electronic device can then be inserted, just like any LRU, into the shelf of the rack 300. The connection interface 303 between the rear panel 301 and the lateral panel 302 is advantageously the connector 204.

In the present solution, the lateral panel 302 can comprise electronic components allowing a multitude of functions to be performed. Thus, the lateral panel 302 can be adapted in order to perform switching functions between the different electrical links originating from the rear panel 301. The switching can be performed by components allowing for switching by relay or by filtering. The lateral panel 302 can be adapted in order to perform so-called "hardware pin programming" functions on the electrical links from the rear panel 301. In other words, the lateral panel 302 can incorporate components allowing a function of "hardware pin programming" type. A plurality of connectors 304 allows a connection to the system of the aircraft. The plurality of connectors 304 can be positioned on any face of the lateral panel 302, for example the front face in the example illustrated. The lateral panel 302 can be adapted in order to convert an electrical, respectively optical, signal into an optical, respectively electrical, signal. The lateral panel 302 can thus allow an interconnection of the shelf of the rack to the system of the aircraft via optical fibers, the lateral panel 302 incorporating optoelectronic converters. The lateral panel 302 can thus comprise components allowing protection against lightning originating from the wiring of the system of the aircraft in order to protect the electronic devices of the shelf of the rack 300.

The wiring of a shelf of a rack can thus be virtually updated rapidly by simple parametrization or configuration of the lateral panel 302 (software parametrizing or via physical switches on the lateral panel 302). It can be possible to replace only the lateral panel 302, without having to touch the rear panel 301, in order to update or adapt the "wiring" of the system of the aircraft. The overhauling or modification of wiring of a shelf of a rack, an operation that was previously lengthy and tedious, can thus be replaced by simply exchanging the lateral panel component 302.

The invention claimed is:

1. An interconnection system for a rack of a system of an aircraft, the interconnection system comprising:
   at least one shelf comprising at least one frame, each frame being adapted to receive an electronic device, each frame comprising a connector allowing, on a first side, a connection of said electronic device, and, on a second side, a connection to the system of the aircraft,
   a rear panel, consisting of a printed circuit, the rear panel comprising:
   as many coupling fittings as connectors of the shelf, each coupling fitting being connected to a second side of a corresponding connector,
   at least one interface for connecting a lateral panel,
   the lateral panel, consisting of an electronic circuit board, the lateral panel comprising:
   at least one interface for connecting the rear panel,
   a plurality of connectors allowing a connection to the system of the aircraft, the printed circuit of the rear panel allowing a set of predefined electrical links between the connectors and the interface, the electronic circuit board of the lateral panel allowing a set of electrical links to be set up between the interface and the connectors to the system of the aircraft, the interconnection system being characterized in that:
   each second side of each connector of the shelf comprises a flexible part configured to bear flexibly on a coupling fitting of the rear panel, each flexible part comprising integrated electrical links,
   each coupling fitting of the rear panel comprising a plurality of electrical contacts, and each second side of the connectors coming to bear flexibly on a coupling fitting of the rear panel when the rear panel is securely fixed to the shelf.

2. The interconnection system as claimed in claim 1, wherein the printed circuit of the rear panel is a multilayer printed circuit.

3. The interconnection system as claimed in claim 1, wherein the printed circuit of the rear panel comprises an electrical link linked to a plurality of electrical links from the connectors.

4. The interconnection system as claimed in claim 1, wherein the printed circuit of the rear panel comprises an electrical link linked:
   on one side to an output interface of the rear panel intended to be connected to a ground of the shelf, and,
   on another side, to a plurality of electrical links from the connectors.

5. The interconnection system as claimed in claim 1, wherein the lateral panel being incorporated in an electronic device (302) that can fit in a frame of the shelf, the interface between the lateral panel and the rear panel is the connector of said frame.

6. The interconnection system as claimed in claim 1, wherein the electronic circuit of the lateral panel is configured to:
   perform switching functions between the electrical links, and/or
   perform "hardware pin programming" functions on the electrical links, and/or
   convert an electrical, respectively optical, signal into an optical, respectively electrical, signal.

* * * * *